United States Patent
Huang et al.

(10) Patent No.: US 7,884,412 B2
(45) Date of Patent: Feb. 8, 2011

(54) SYSTEM AND METHOD OF FORMING A SPLIT-GATE FLASH MEMORY STRUCTURE INCLUDING PARTIAL CIRCULAR SIDEWALLS OF THE FLOATING GATES AND CONTROL GATES

(75) Inventors: Shieh Feng Huang, Taoyuan (TW); Jiun Nan Chen, Taipei (TW); Lien Yo Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 338 days.

(21) Appl. No.: 11/562,731

(22) Filed: Nov. 22, 2006

(65) Prior Publication Data
US 2007/0145457 A1    Jun. 28, 2007

Related U.S. Application Data

(62) Division of application No. 10/873,694, filed on Jun. 22, 2004, now Pat. No. 7,148,098.

(51) Int. Cl.
*H01L 29/788* (2006.01)
*H01L 29/76* (2006.01)

(52) U.S. Cl. ...................................... 257/315; 257/319

(58) Field of Classification Search ................. 257/315, 257/319, E29.319
See application file for complete search history.

(56) References Cited

U.S. PATENT DOCUMENTS

| 6,284,598 | B1 * | 9/2001 | Kelley et al. ................. 438/257 |
| 6,309,928 | B1 * | 10/2001 | Sung et al. ................... 438/265 |
| 2001/0012662 | A1 | 8/2001 | Hsieh et al. |
| 2003/0073276 | A1 | 4/2003 | Lin et al. |
| 2004/0238852 | A1 * | 12/2004 | Lee et al. ...................... 257/204 |

OTHER PUBLICATIONS

Stanley Wolf Ph.D. In Silicon Processing for the VLSI Era, vol. 2: Process Integration, Lattice Press, 1990, pp. 195-199.*
Stanley Wolf Ph.D. in Silicon Processing for the VLSI Era, vol. 2: Processs Integration, Lattice Press, 1990, p. 194.*
Rebecca Mih et al., "0.18um Modular Triple Self-Aligned Embedded Split-gate Flash Memory", 2000 Symposium on VLSI Technology Digest of Technical Papers, pp. 120-121.*

* cited by examiner

*Primary Examiner*—William M. Brewster
(74) *Attorney, Agent, or Firm*—Haynes and Boone, LLP

(57) ABSTRACT

A method for forming a split-gate flash memory structure includes etching a first gate layer to form one or more floating gates and forming an isolation layer over the floating gates. An insulation layer is deposited over the isolation layer and planarized.

12 Claims, 14 Drawing Sheets

SYSTEM AND METHOD OF FORMING A SPLIT-GATE FLASH MEMORY STRUCTURE INCLUDING PARTIAL CIRCULAR SIDEWALLS OF THE FLOATING GATES AND CONTROL GATES

RELATED APPLICATION

This application is a divisional of U.S. patent application Ser. No. 10/873,694 filed Jun. 22, 2004, and entitled, "System and Method of Forming a Split-Gate Flash Memory Structure," now U.S. Pat. No. 7,148,098 issued on Dec. 12, 2006, which is hereby incorporated by reference in its entirety.

BACKGROUND

Memory devices such as electrically erasable and programmable read-only memories (EEPROMs) and flash electrically erasable and electrically programmable read-only memories (flash EEPROMs) often include functions of electrical programming and erasing. To perform such functions, these memory devices often include either a stacked-gate structure or a split-gate structure.

One of the shortcomings of the stacked-gate structure is the "over-erasure" of the cell contents during erase operations. When erasing memory content, the erase operation is normally sustained for a slightly prolonged time period to ensure complete removal of the electrons previously injected. However, sometimes such a prolonged erase operation results in the removal of excess electrons. As a result, electron holes may form in the floating gate of the device. In severe cases, the stacked-gate transistor may become a depletion transistor, which conducts even in the absence of a control voltage at the control gate.

Split-gate devices are often used to overcome the memory over-erasure shortcoming of stacked-gate devices. Typically, such a device includes a transistor that includes a control gate and a floating gate. The principal advantage of such a configuration is that the transistor is not affected by the state of the floating gate. Instead, the memory transistor remains in its off state, even if the floating-gate is subject to the phenomenon of over-erasure and therefore is in a conductive state. Accordingly, the transistor can maintain its correct state irrespective of the over-erasure condition.

With the advancement of fabrication processes and materials, semiconductor device geometries have continued to decrease. For example, currently, fabrication facilities are producing devices with geometry sizes (e.g., the smallest component or line that may be created using the process) of less than 90 nm. However, the reduction of geometrical sizes frequently introduces new challenges. For example, size reduction of the devices calls for decreased sizes of flash memory cells. However, significant size reduction of flash memory cells may not be achieved pursuant to previously available methods.

Therefore, it is desired to provide an improved system and method of forming split-gate flash memory structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
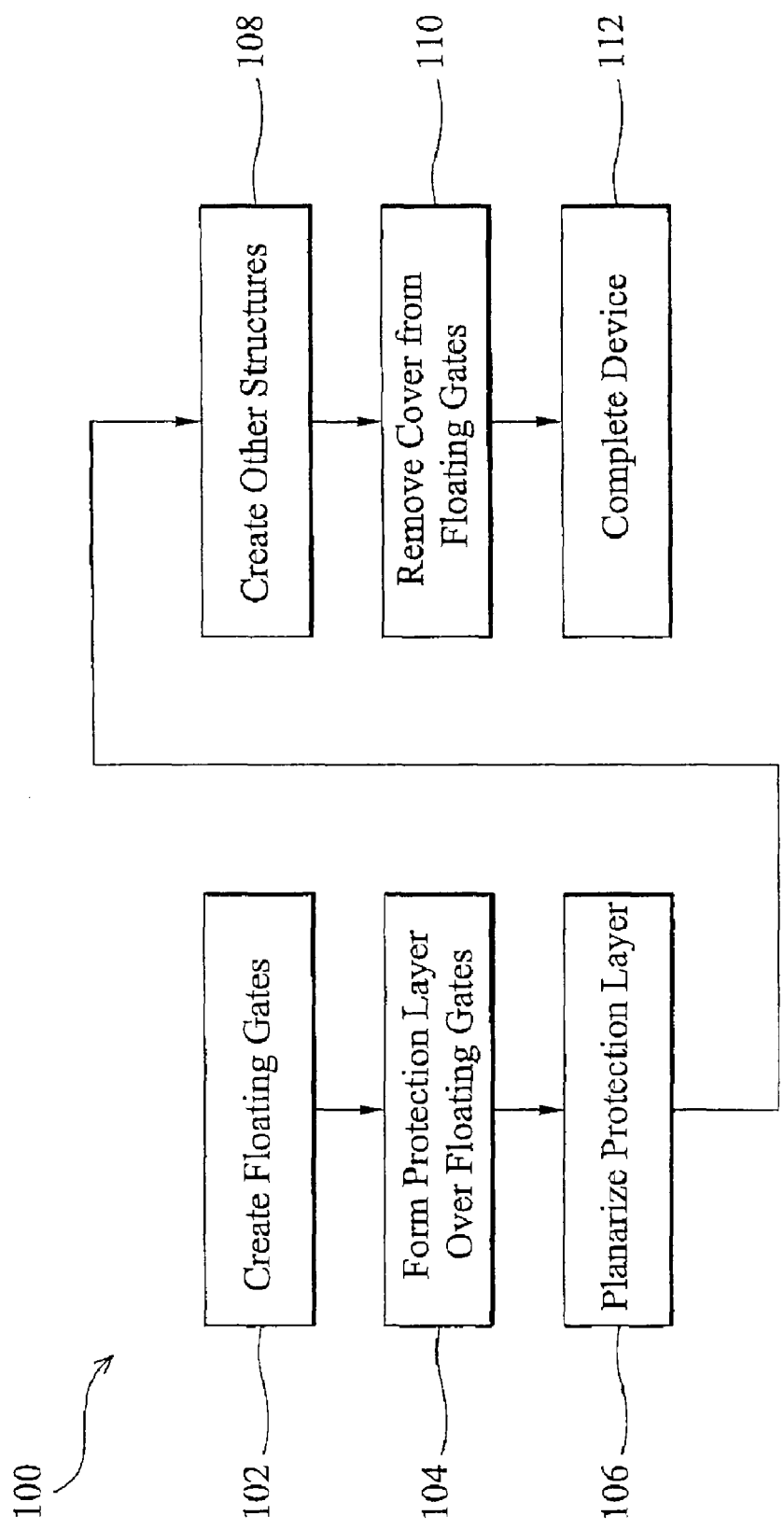
FIG. 1 is a flowchart of a simplified processing method for implementing one or more embodiments of the present invention.

The present invention relates generally to the manufacturing of semiconductor devices, and more particularly to a system and method of forming a split-gate flash memory structure.

For the purposes of promoting an understanding of the principles of the invention, references will now be made to the embodiments, or examples, illustrated in the drawings and specific languages will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring now to FIG. 1, a method 100 can be performed to create a semiconductor device according to embodiments of the present invention. It is understood that the method 100 is simplified, and additional steps may be performed before, during, or after the method. The method 100 will be discuss briefly below, and then a more detailed example of the method will be described with reference to FIGS. 2-10, below.

Execution begins at step 102, in which a first pair of floating gates are created for a microelectronic device. At step 104, the floating gates are covered with one or more protection layers. At step 106, the protection layer(s) can be planarized, such as by chemical mechanical polishing. At step 108, isolation regions are created for the microelectronic device. One example of an isolation region would be a shallow trench isolation (STI). At step 110, the protection layer(s) are removed, thereby partially or fully re-exposing the floating gates. At step 112, insulating layers, control gates, source/drain regions, and/or other structures are formed to complete creation of the microelectronic device.

Figure 2:
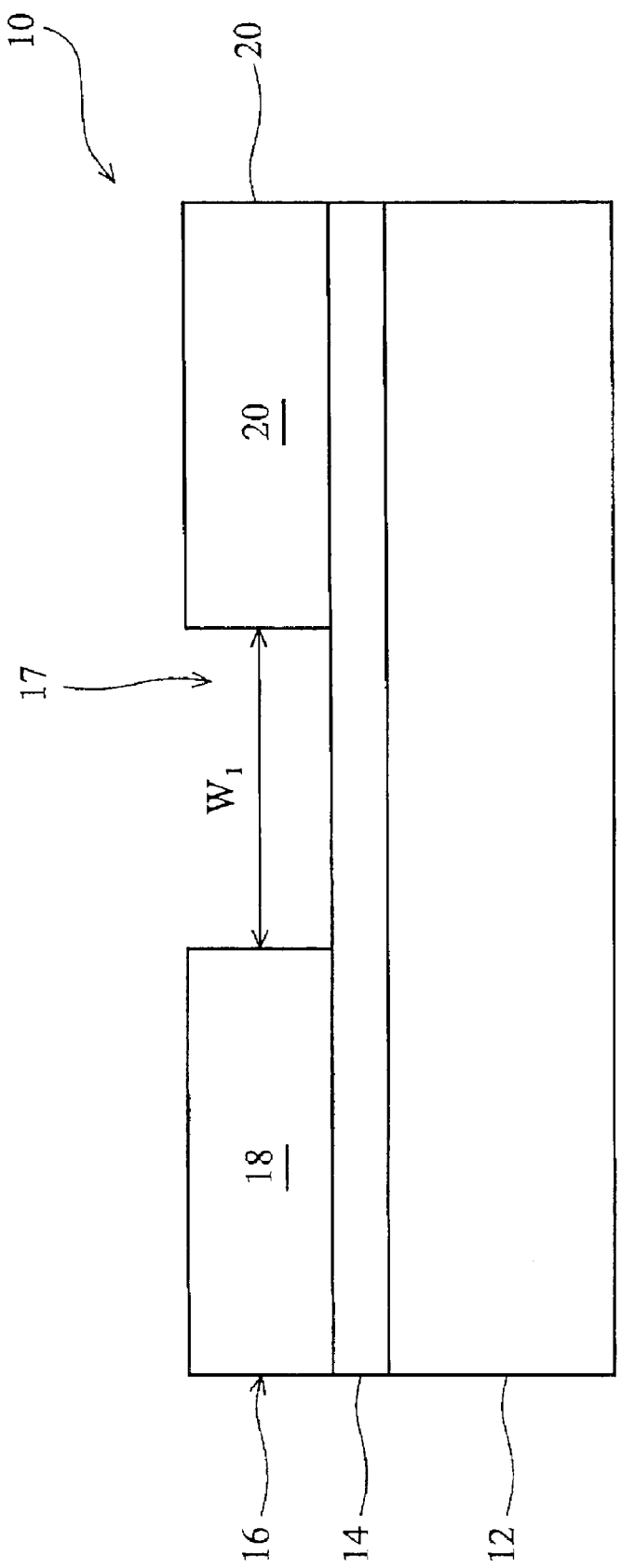
FIGS. 2-10 illustrate cross-sectional views of a semiconductor device being processed according to various embodiments of the present disclosure

Referring now to FIG. 2, shown therein is a cross-sectional view of a semiconductor device 10 upon which one or more embodiments of the method 100 of FIG. 1 can be implemented. The semiconductor device 10 includes a substrate 12, an oxide layer 14, and a silicon nitride layer 16 according to one embodiment of the present disclosure. The substrate 12 may be a single crystal or other silicon substrate, a silicon-on-insulator (SOI) substrate including a silicon or germanium epitaxial layer on a silicon or sapphire substrate, a plastic or other flexible substrate, or other conventional or future-developed substrates. The substrate 12 may be or include a contact to a semiconductor device or interconnect. For example, the substrate 12 may be or include a semiconductor wafer or other layers formed on a semiconductor substrate.

In furtherance of the example, the oxide layer 14 may include $SiO_2$, $Ta_2O_5$, $Hf_2O$, $ZrO_2$ or other dielectric materials to provide a desired oxide thickness, and may be formed by atomic layer deposition (ALD), chemical vapor deposition (CVD), physical vapor deposition (PVD), thermal or rapid-thermal-processing (RTP) oxidation, in-situ steam generation (ISSG) RTP oxidation, or other methods. In one example, the oxide layer 14 may be formed thermally in dry oxygen and an oxidation furnace at a temperature of approximately between 650° C. and 950° C., and to a desired thickness. The oxide layer 14 may have an approximate thickness of between 40 Angstroms and 140 Angstroms. However, other temperatures and thicknesses are also contemplated.

In this example, a dielectric layer 16, which may include silicon nitride, silicon oxynitride, silicon carbide or other suitable materials, may be formed on the oxide layer 14 by ALD, CVD, PVD, RTP, or other methods. In one example, the dielectric layer 16 may be deposited on the oxide layer 14 at a temperature of between approximately 630° C. and 940° C., and to a desired thickness of approximately between 3000 Angstroms and 5000 Angstroms. However, other temperatures and thicknesses are also contemplated.

The dielectric layer 16 is etched to create a defined area 17 between dielectric layer components 18 and 20. The area 17 may be formed by etching of the dielectric layer 16 using a patterned mask. It is understood that many techniques for forming openings in dielectric layers are known in the art, and will not be further described herein. The area 17 may include a width w1 of approximately between 0.41 micrometer and 0.71 micrometer. However, a larger or smaller width is also contemplated by the present disclosure.

Figure 3A:
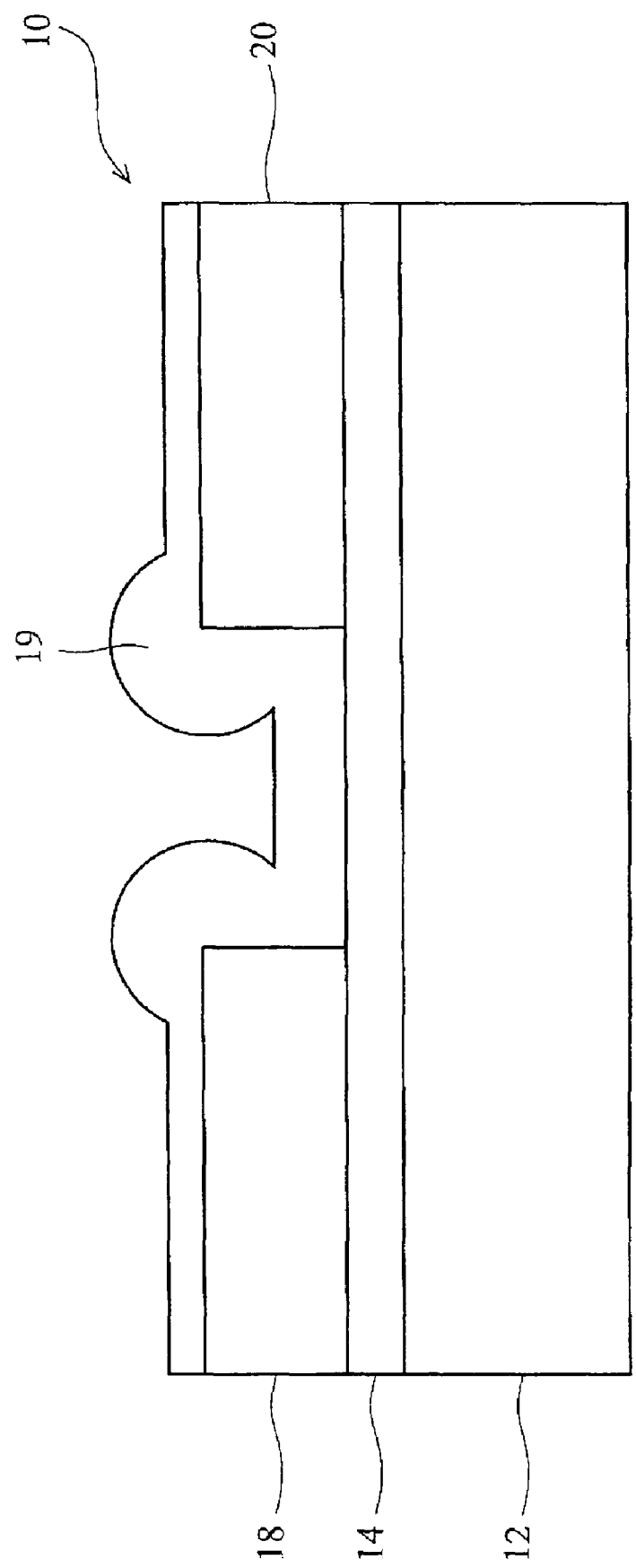

Referring now to FIG. 3A, the semiconductor device 10 includes a first gate layer 19 according to one embodiment of the present disclosure. In this embodiment, the first gate layer 19 may include polycrystalline silicon, and may be formed through a variety of methods, including but not limited to, CVD, PVD, or ALD. In one example, the first gate layer 19 may be formed at approximately between 470° C. and 780° C., and to a thickness of approximately between 800 Angstroms and 1200 Angstroms. However, other temperatures and thicknesses are also contemplated for forming the first gate layer 19. Further, conductive materials, such as Cu, Al, Ni, Co, metal silicide, metal oxide, metal, or tungsten silicide; or other suitable materials, may be used to replace the polycrystalline silicon material for the first gate layer 19.

Figure 3B:
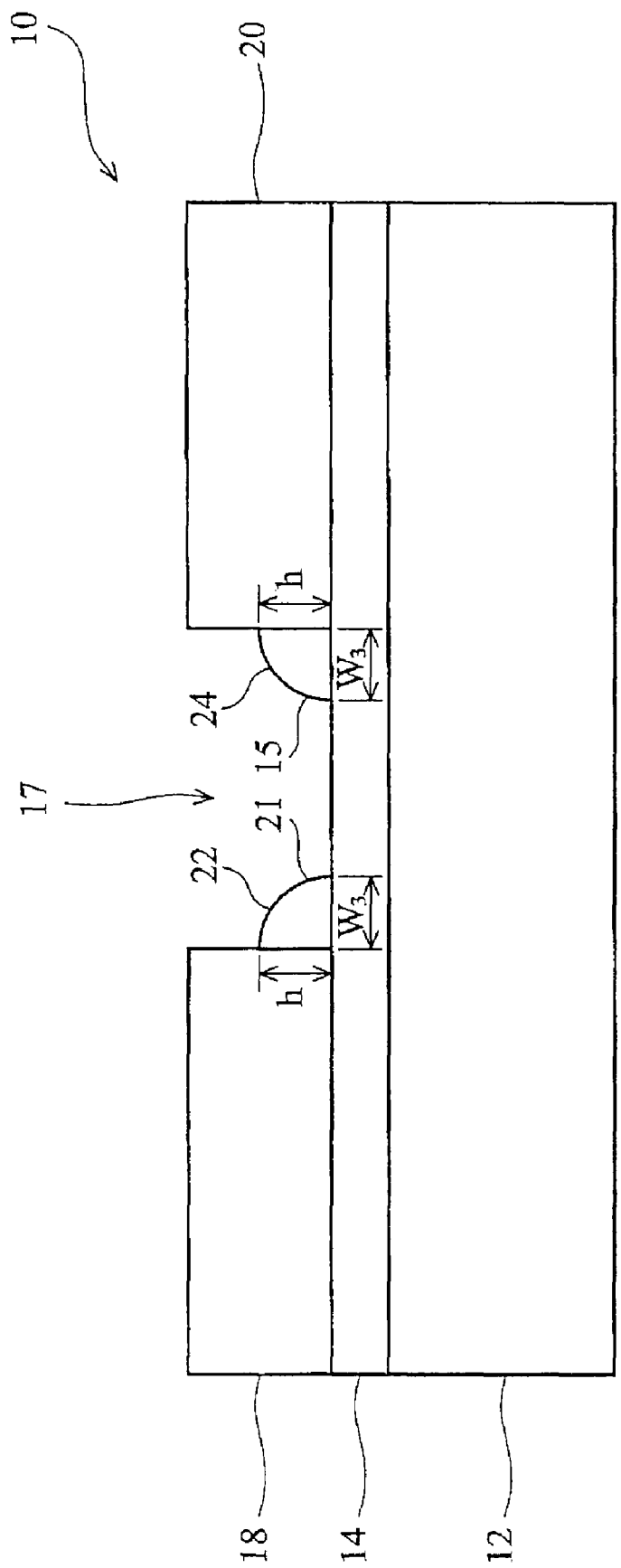

Referring now to FIG. 3B, floating gates 22 and 24 are then formed in the defined area 17. In this embodiment, etching, which may include dry etching, chemical etching or other processes, may be performed on the first gate layer 19 of FIG. 3A to form the floating gates 22 and 24. The floating gates 22 and 24 may include a variety of shapes and sizes. In one example, each of the widths w2 and w3 of the floating gates 22 and 24 may be approximately between 0.13 micrometer and 0.23 micrometer. However, it is also contemplated that each of the widths w2 and w3 may be smaller than 0.13 micrometer or larger than 0.23 micrometer. Further, even though the width w2 is shown to be equal to the width w3, it is also contemplated that the width w2 may differ from the width w3.

In another example, each of the heights h1 and h2 of the floating gates 22 and 24 may be less than 5000 Angstroms. However, it is also contemplated that each of the heights h1 and h2 may be equal to or larger than 5000 Angstroms. In this illustration, the height h1 is shown to be equal to the height h2. However, it is also contemplated that h1 may differ from h2. Although the floating gates 22 and 24 are shown to possess partial circular side walls 21 and 15, it is also contemplated that the side walls 21 and 15 may include other regular or irregular shapes. Therefore, a great number of variations are contemplated for the floating gates 22 and 24.

Figure 3C:
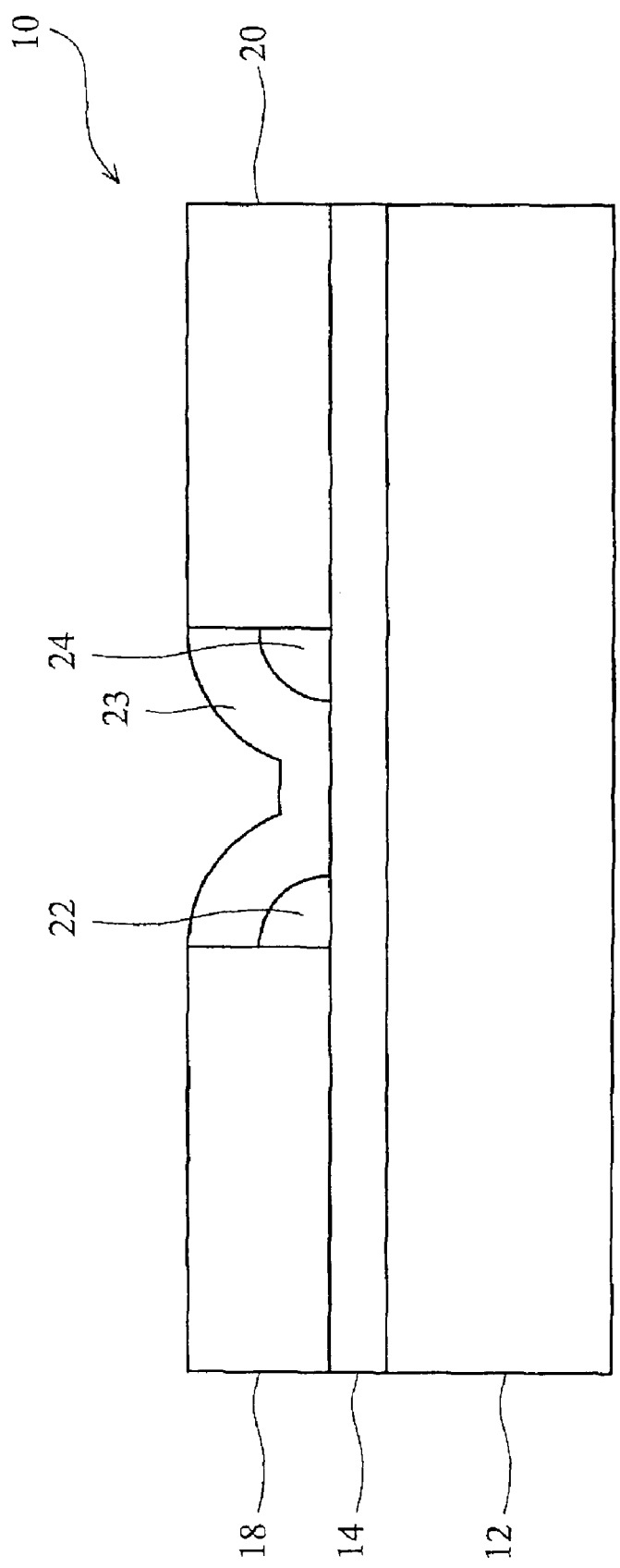

Referring now to FIG. 3C, an isolation layer 23 is formed over the floating gates 22, 24. The isolation layer 23 may be utilized to protect the floating gates 22 and 24 from a shallow trench isolation (STI) scheme discussed below. In this embodiment, the isolation layer 23 may include polyoxides, $SiO_2$, $Ta_2O_5$, $Hf_2O$, $ZrO_2$ or other dielectric materials to provide a desired oxide thickness, and may be formed by ALD, CVD, PVD, RTP oxidation, ISSG RTP oxidation, or other methods. In one example, the isolation layer 23 may be formed thermally in dry oxygen and an oxidation furnace at a temperature of approximately between 700° C. and 900° C., and to a desired thickness of about between 100 Angstroms and 300 Angstroms. However, other temperatures and thicknesses are also contemplated by the present disclosure.

Figure 3D:
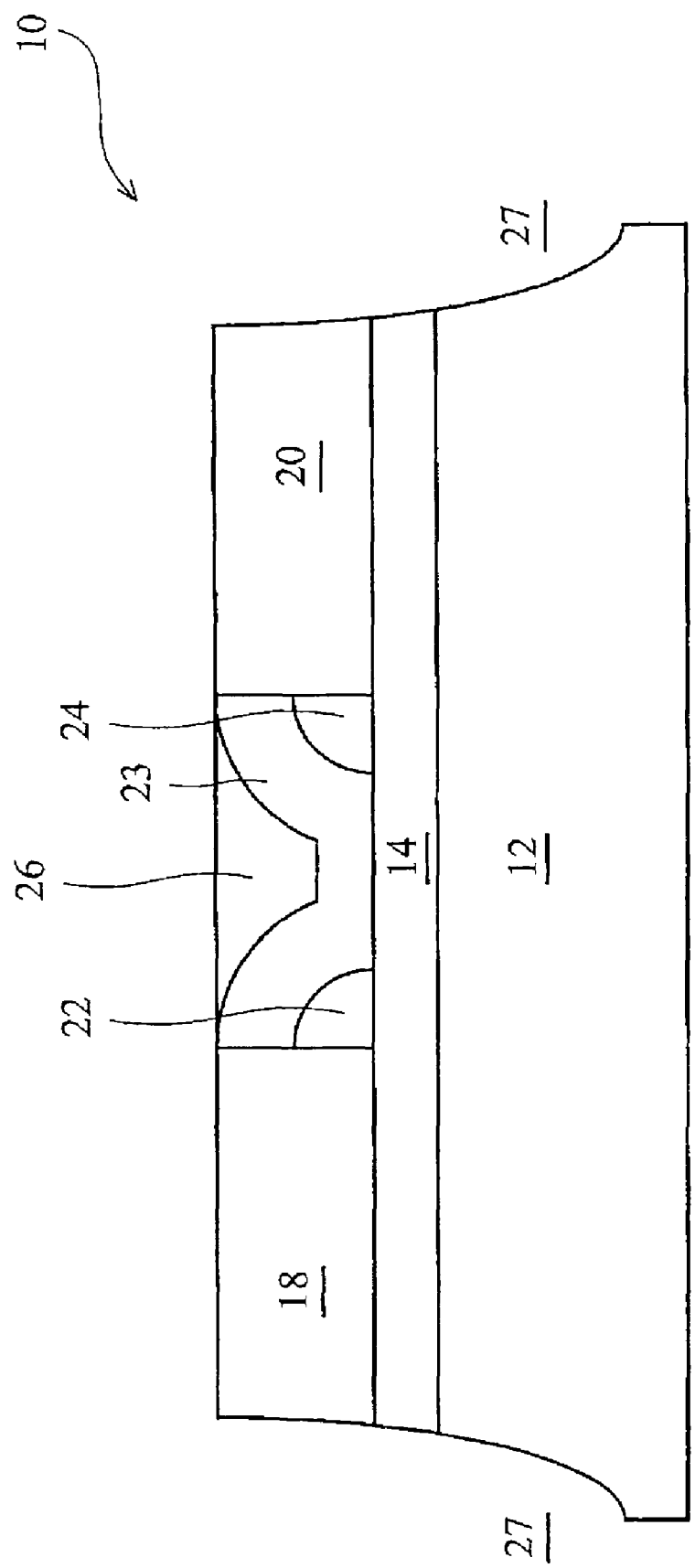

Referring now to FIG. 3D, the semiconductor device 10 further includes an insulation layer 26 over the isolation layer 23. The insulation layer 26 may include tetha ethyl ortho silicate (TEOS), polyimide, porous silica, other proper low-k materials, or any other suitable materials. It may be formed by CVD, PVD, Spin-on, or other methods. In one example, an original insulation layer may be deposited at a temperature of approximately between 550° C. and 850° C., and to a desired thickness of about between 2000 Angstroms and 4000 Angstroms. Following the deposition, chemical mechanical polishing may be applied to the original insulation layer to form the insulation layer 26. In the present embodiment, any insulation layer over the dielectric layers 18, 20 is removed, although this is not required. It is understood that chemical mechanical polishing is known in the art, and will not be further described herein.

In furtherance of the example, an isolation scheme may be applied to one or more other parts of the semiconductor device 10. For the sake of example, two STIs 27 are formed in the substrate 12. Other examples of isolation include local oxidation of silicon (LOCOS), and/or other electrical isolation features Referring to FIG. 4A, once the isolation scheme has been implemented, one or both of the insulation layers 26 and 23 of FIG. 3D are etched to expose floating gates 22a, 24a. The floating gates 22a, 24a are similar to the floating gates 22, 24 of FIG. 3B, except that they have gone through the above-described processing. For example, even though the isolation layer 23 has been removed, it is noted that some residue of the isolation layer 23 (not shown) may remain on or over the surfaces 22a and 24b.

Figure 4A:
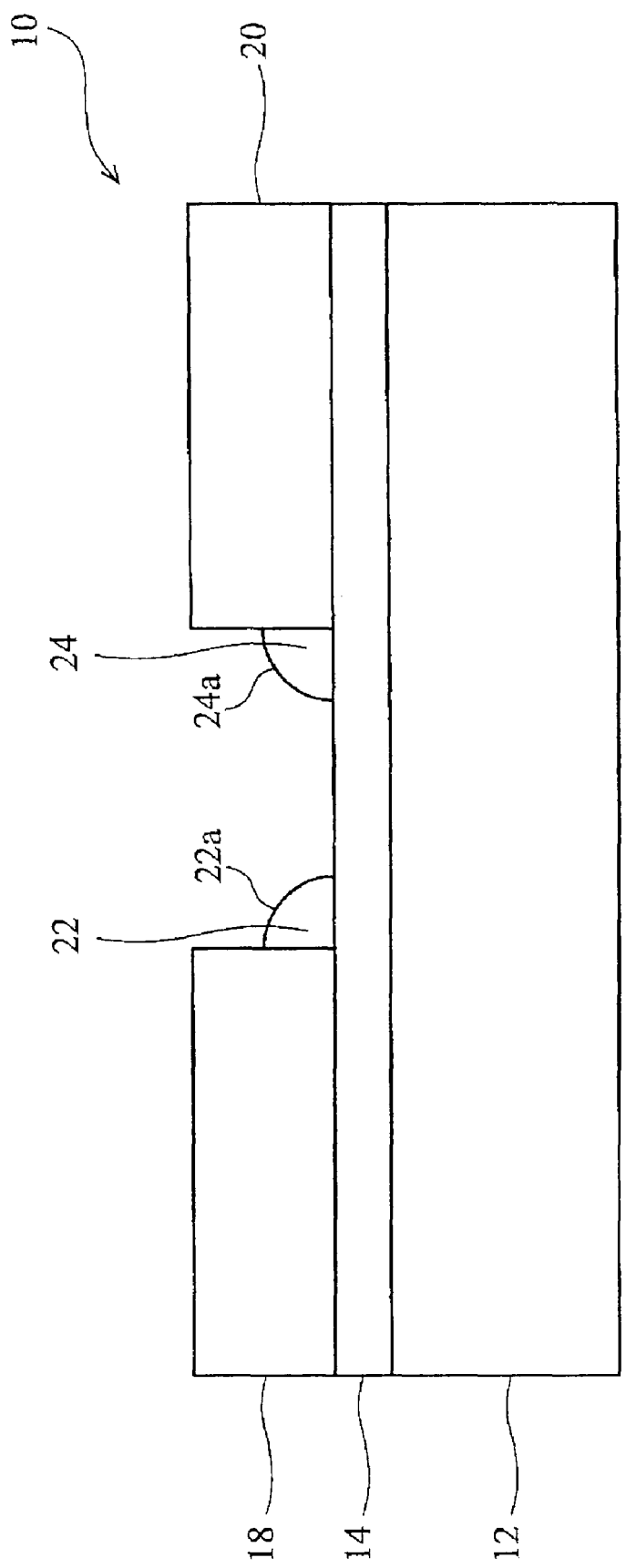
Figure 4B:
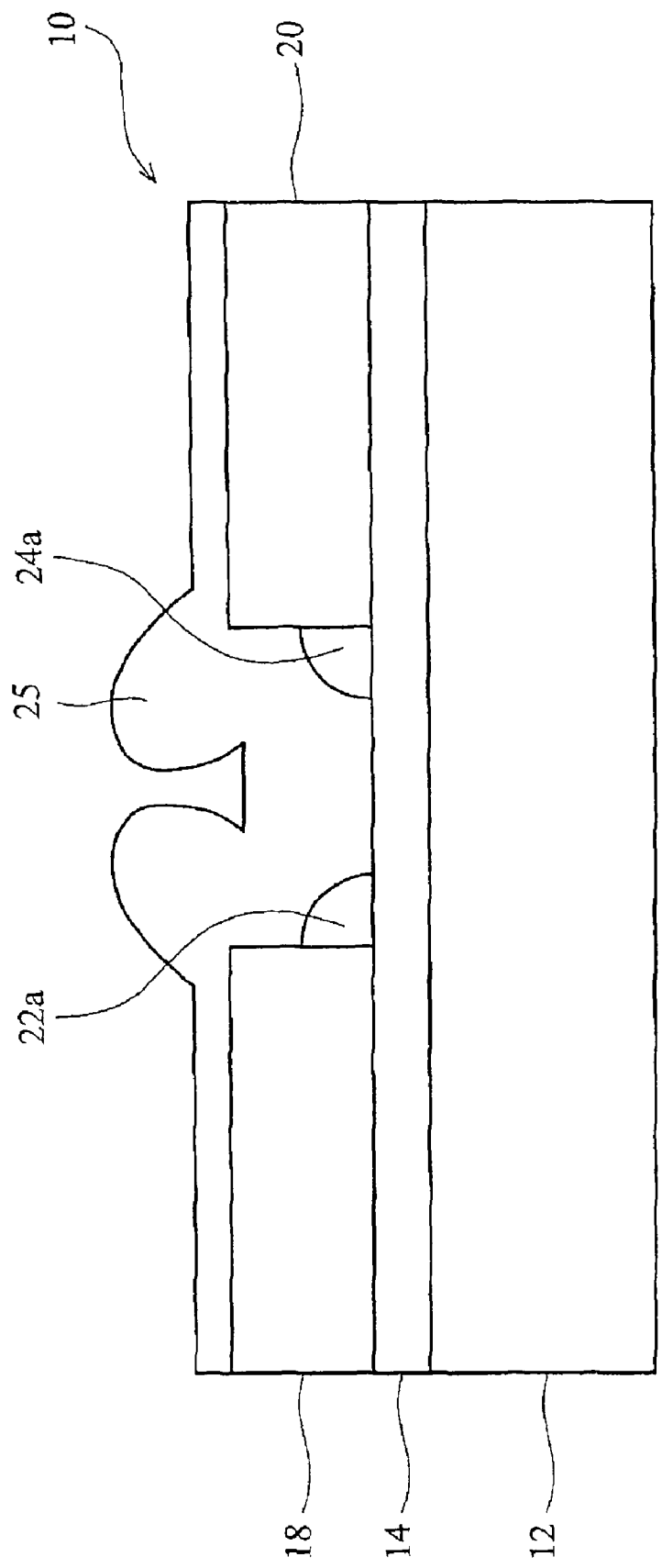

Referring now to FIG. 4B, an insulation layer 25 is formed over and floating gates 22a and 24a. In this embodiment, the insulation layer 25 may include TEOS, polyimide, porous silica, low-k materials, or any suitable materials, and may be formed by CVD, PVD, spin-on, or other methods. In one example, the insulation layer 25 may be deposited at a temperature of approximately between 550° C. and 850° C., and to a desired thickness of about between 2000 Angstroms and 4000 Angstroms. However, other temperatures and thicknesses are also contemplated by the present disclosure.

Figure 5:
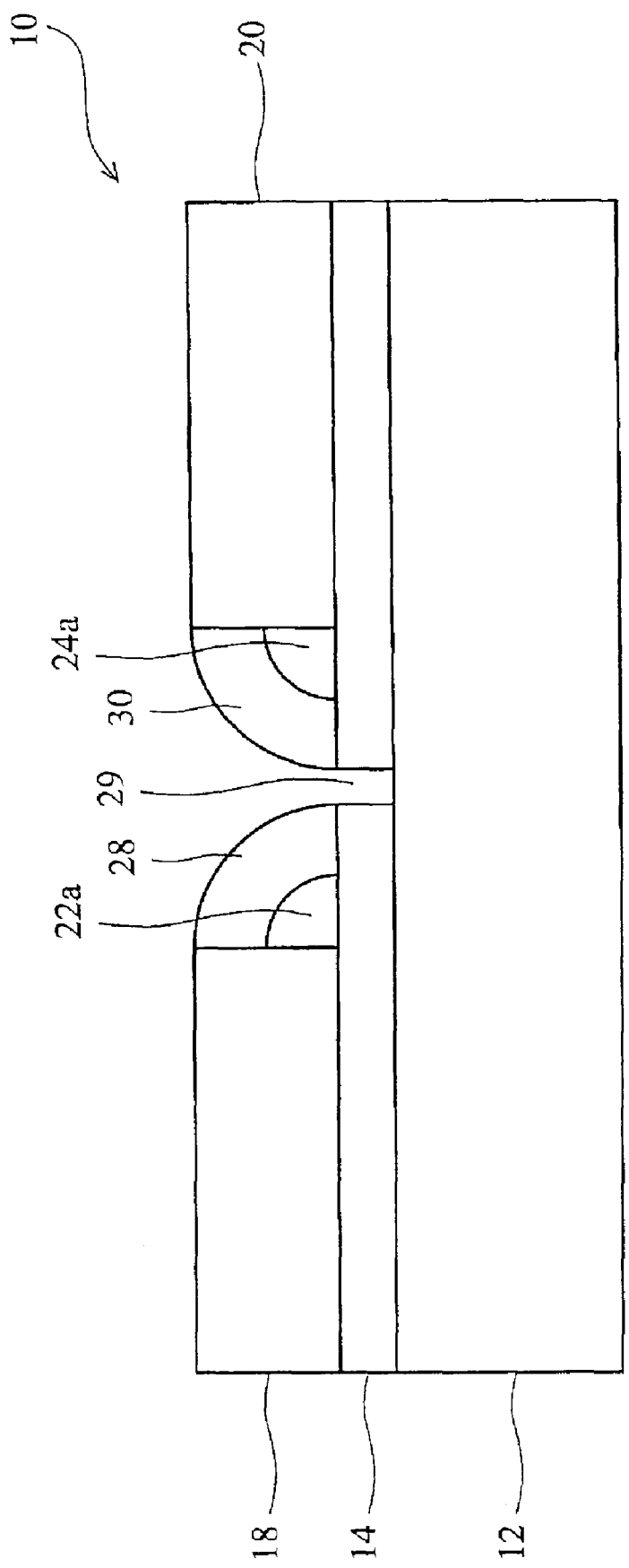

Referring now to FIG. 5, insulation spacers 28 and 30 are formed over floating gates 22a and 24a, respectively. In this embodiment, etching, which may include dry etching, chemical etching, or other suitable processes, may be applied to the insulation layer 25 of FIG. 4B to form the spacers 28 and 30. Furthermore, in the present embodiment, the etching also can create a space 29 in the oxide layer 14.

Figure 6:
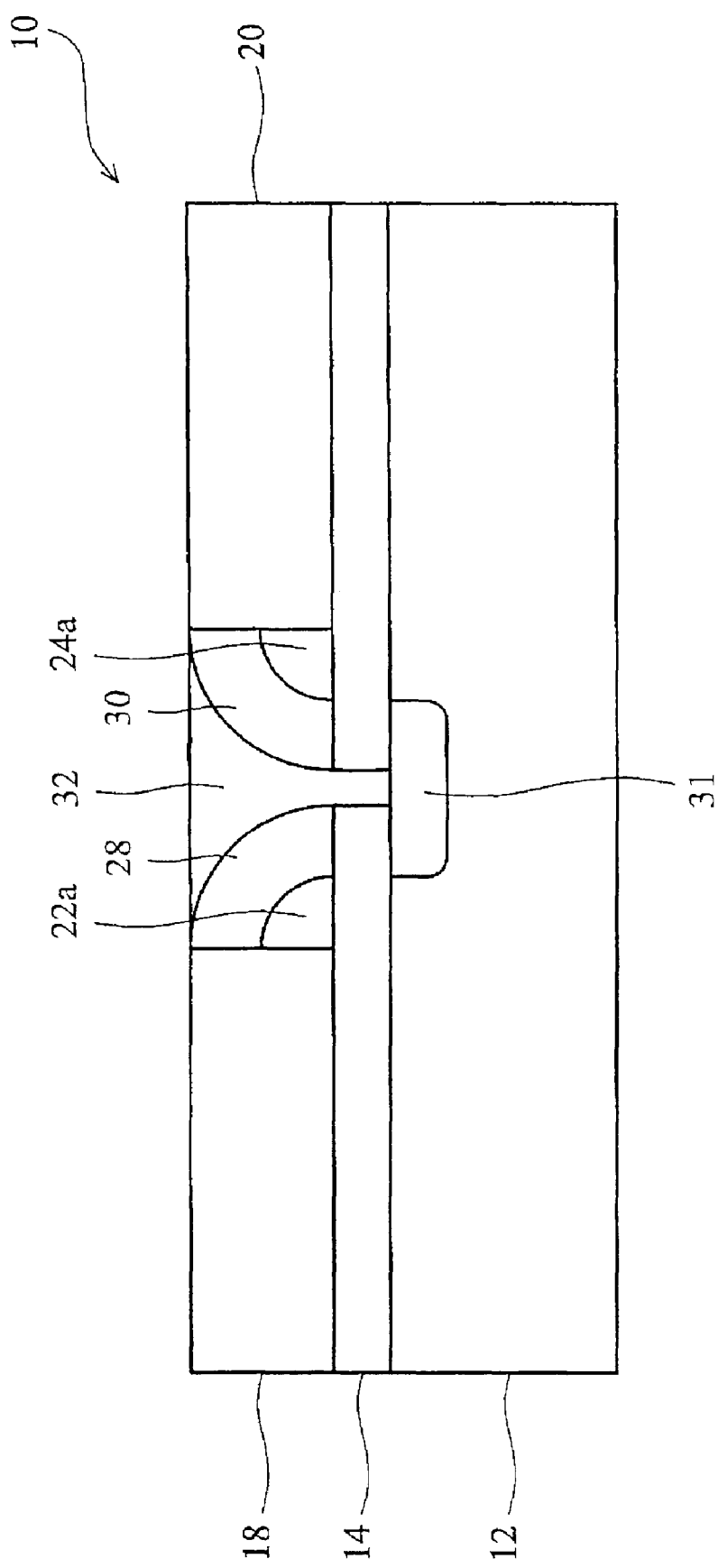

Referring now to FIG. 6, a source implant 31 and a polycrystalline silicon layer 32 are formed on the semiconductor device 10. In this embodiment, the source implant region 31 may be formed by diffusion or any conventional method known in the art. In some embodiments, the source implant region 31 can be performed earlier in the process.

In one embodiment, the polycrystalline silicon layer 32 is formed by creating an overlying polycrystalline silicon layer through a variety of methods, including but not limited to, CVD, PVD, ALD, or other methods. In one example, the polycrystalline silicon layer may be formed at approximately between 380° C. and 680° C., and to a thickness of approximately between 3500 Angstroms and 5500 Angstroms. However, other temperatures and thicknesses are also contemplated for forming the polycrystalline silicon layer. The polycrystalline silicon material may be doped or undoped, and any other suitable materials, such as Cu, Al, Ni, Co, metal silicide, fungsten, silicide, and/or other materials may be used to replace the polycrystalline silicon material. Thereafter, chemical mechanical polishing and/or etching, which may include dry etching, chemical etching, and other processes, may be applied to form the polycrystalline silicon layer 32.

Figure 7:
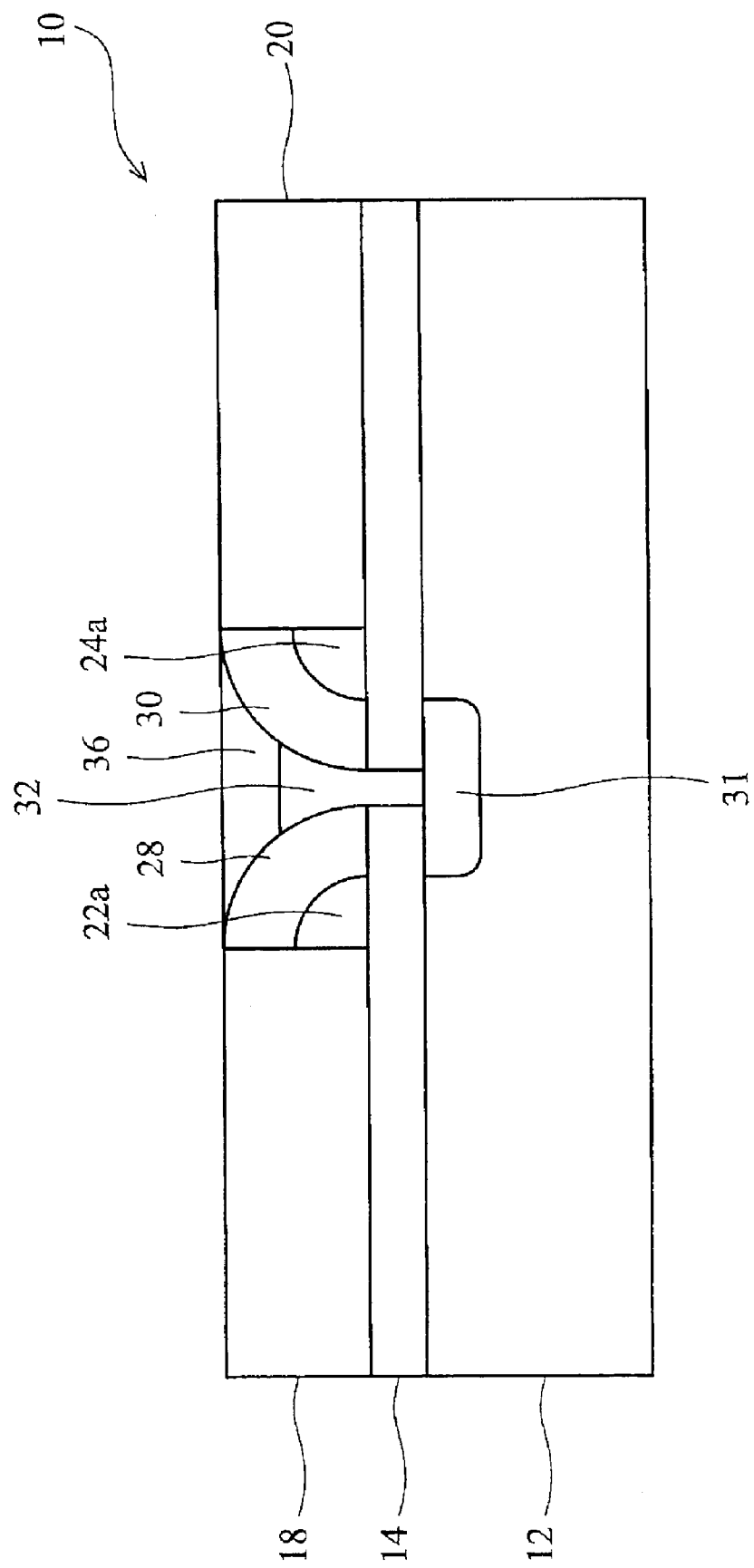

Referring now to FIG. 7, an oxide layer 36 is then formed over the polycrystalline silicon layer 32. In this embodiment, the oxide layer 36 may include $SiO_2$, $Ta_2O_5$, $Hf_2O$, $ZrO_2$ or other dielectric materials to provide a desired oxide thickness, and may be formed by ALD, CVD, PVD, RTP, or other methods. In one example, the oxide layer 36 may be formed thermally in dry oxygen and an oxidation furnace at a temperature of approximately between 700° C. and 900° C., and to a thickness of about between 50 Angstroms and 150 Angstroms. However, other temperatures and thickness are also contemplated.

Figure 8:
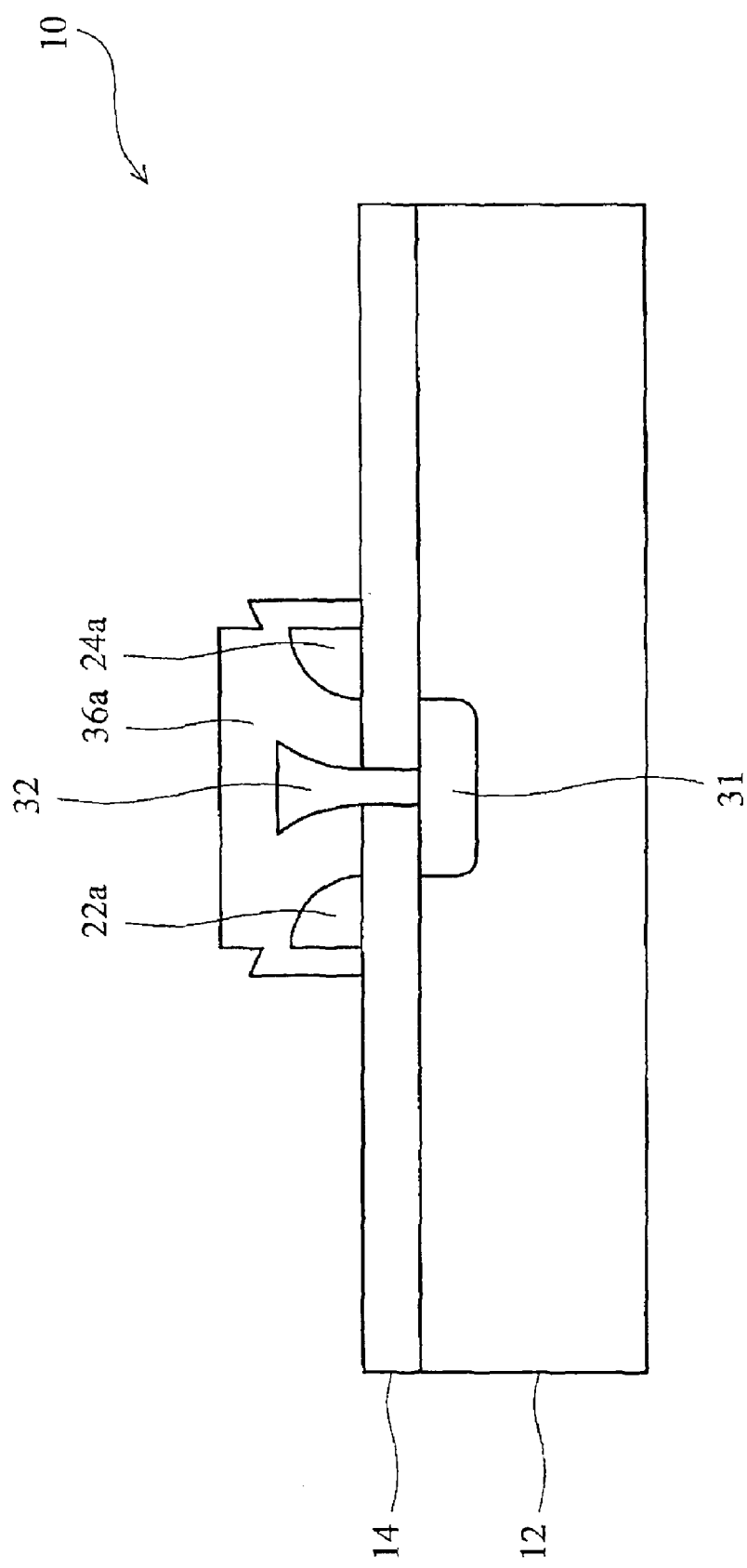

Referring now to FIG. 8, the dielectric layer components 18 and 20 of FIG. 7 may be stripped by methods known in the art. Then, high temperature oxide (HTO) and inter-poly oxide (IPO), both of which are known in the art, may be applied at approximately between 600° C. and 1000° C., and to a thickness of about between 100 Angstroms and 205 Angstroms to further refine the semiconductor device. Insulation spacers 28, 30 and oxide layer 36, collectively referred to as layer 36a, eventually form a layer around the floating gates 22a and 24a and the polycrystalline silicon layer 32.

Figure 9:
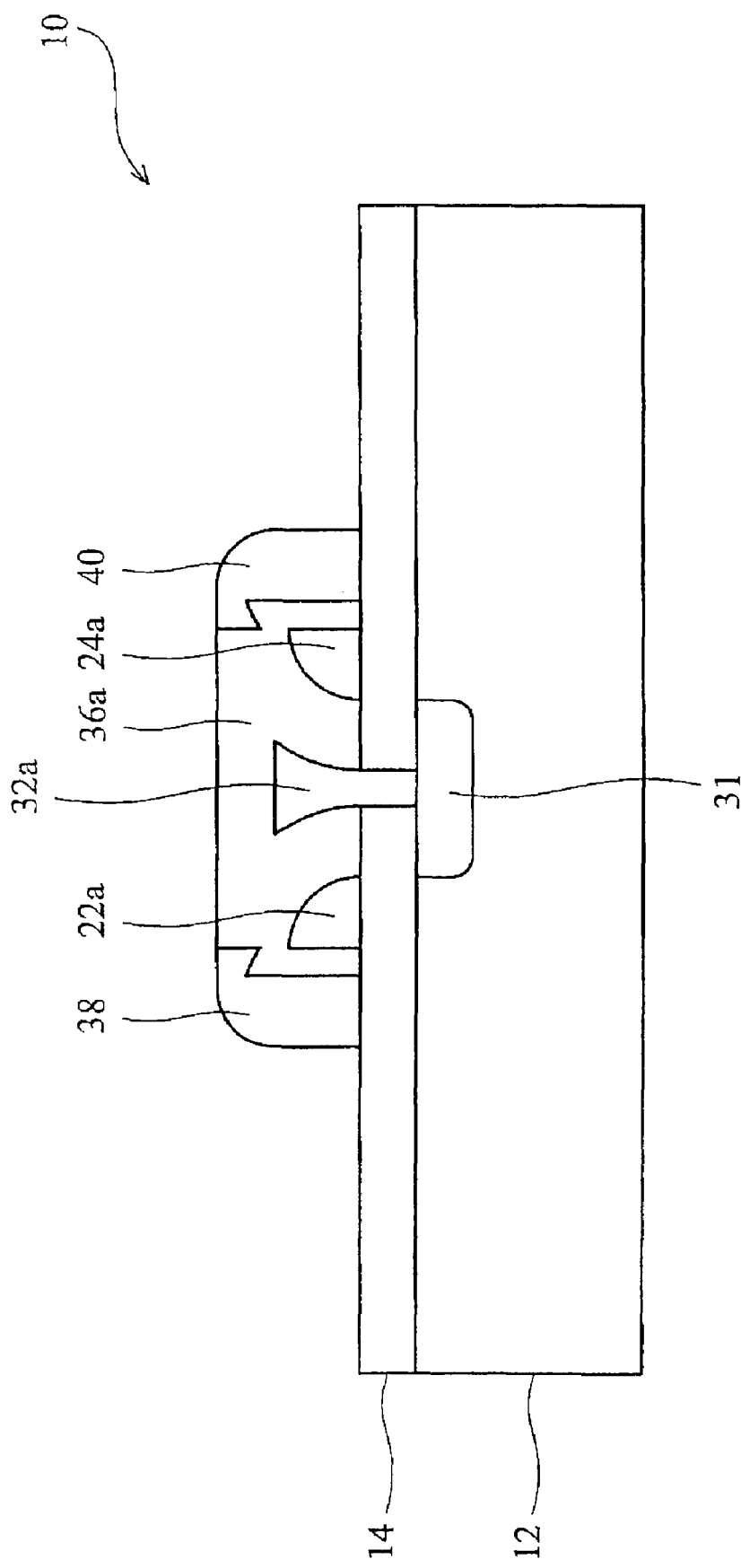

Referring now to FIG. 9, control gates 38 and 40 are then formed on the semiconductor device 10. In one embodiment, a polycrystalline silicon layer may be formed over the device 10 through a variety of methods, including but not limited to, CVD, PVD, ALD, or other methods. In one example, the polycrystalline silicon layer may be formed at approximately between 420° C. and 820° C., and to a thickness of approximately between 1000 Angstroms and 2200 Angstroms. However, other temperatures and thicknesses are also contemplated for forming the polycrystalline silicon layer. The polycrystalline silicon material may be replaced by any other suitable materials, such as Cu, Al, Ni, Co, metal silicide, fungsten, silicide or other materials. Once formed, the polycrystalline silicon layer is etched, which may include dry etching, chemical etching, or other processes, to form the control gates 38 and 40 as shown in FIG. 9.

Figure 10:
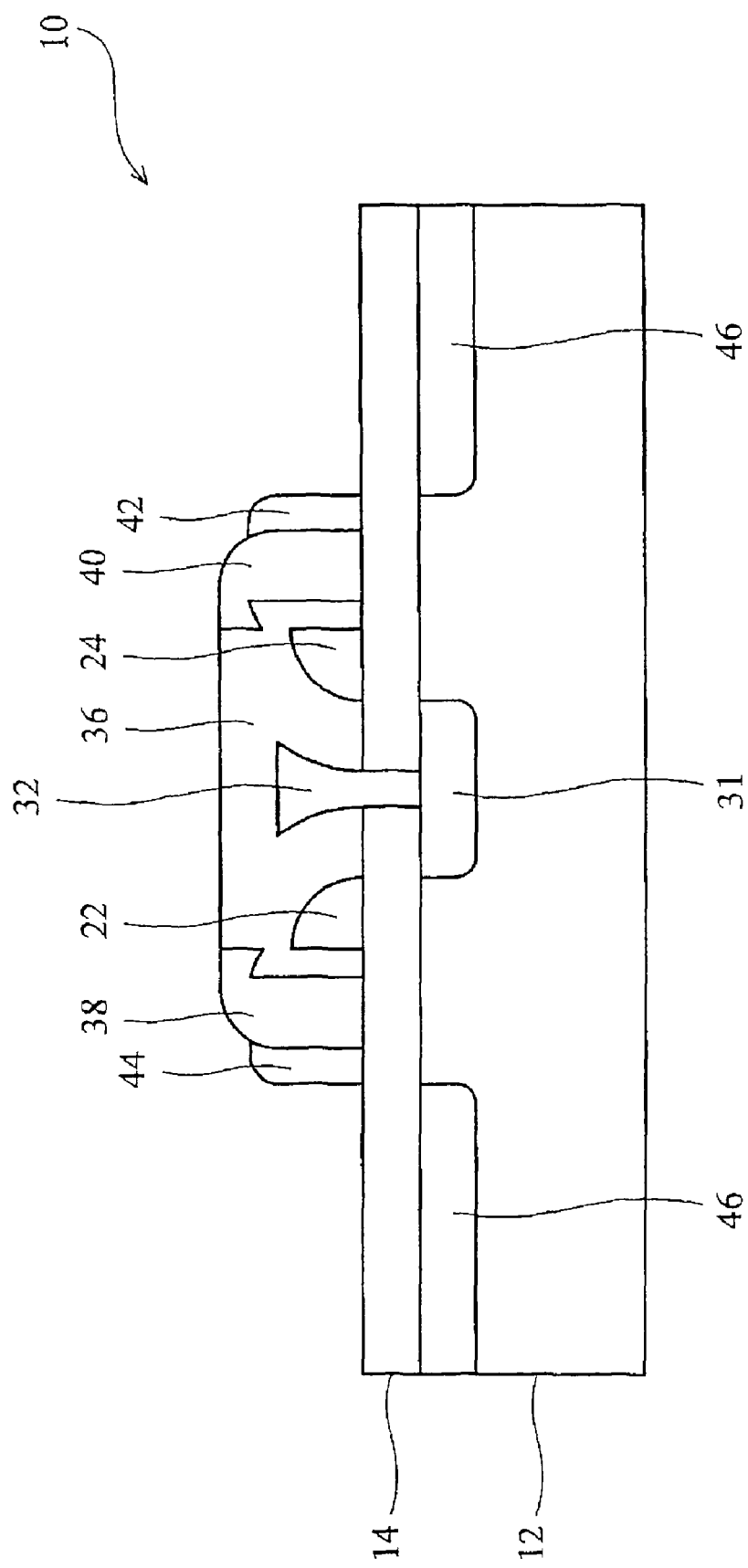

Referring now to FIG. 10, in furtherance of the example and according to methods known in the art, a lateral diffusion drain (LDD) may be implanted, spacers 42 and 44 may be formed, and drain regions 46 may be implanted in the semiconductor device 10. As a result, a completed device is thereby formed. In some embodiments, a resulting cell size using the semiconductor device 10 is significantly lower than that of the prior art.

Although only a few exemplary embodiments of this invention have been described in detail above, those skilled in the art will readily appreciate that many modifications are possible in the exemplary embodiments without materially departing from the novel teachings and advantages of this invention. Also, features illustrated and discussed above with respect to some embodiments can be combined with features illustrated and discussed above with respect to other embodiments. Accordingly, all such modifications are intended to be included within the scope of this invention.

What is claimed is:

1. A split-gate device comprising:
a pair of floating gates over a substrate;
a polysilicon structure between the pair of floating gates;
a pair of control gates;
an insulation layer over the floating gates and between the floating gates and the control gates and between the floating gates and the polysilicon structure; and
an isolation structure;
wherein the floating gates and the control gates each have a partial circular sidewall profile, wherein the floating gates each have a bottom surface that is co-planar with a bottom surface of each of the control gates, and wherein a height of the floating gates and a height of the polysilicon structure is lower than a height of the control gates.

2. The device of claim 1 wherein the isolation structure is a shallow trench isolation.

3. The device of claim 1 wherein the pair of floating gates include remnants disposed therein from a removed protective layer, remnants including tetha ethyl ortho silicate (TEOS).

4. The device of claim 1 wherein each floating gate includes a width ranging from about 0.13 to about 0.23 micrometer.

5. The device of claim 1 wherein the insulation layer includes TEOS.

6. The device of claim 1 further comprising a polysilicon structure disposed within the insulation layer and between the floating gates.

7. A split-gate device comprising:
a semiconductor substrate;
an oxide layer formed over the semiconductor substrate;
a first floating gate and a second floating gate formed over the oxide layer, wherein the first and second floating gates each have a first partial circular sidewall and a first bottom surface;
a polysilicon structure formed between the first floating gate and the second floating gate;
a first control gate and second control gate formed over the oxide layer, wherein the first and second floating gates are disposed between the first and second control gates and wherein the first and second control gates each have a second partial circular sidewall and a second bottom surface, wherein the first bottom surface and second bottom surface are co-planar, and wherein a height of the first and second floating gates and a height of the polysilicon structure is lower than a height of the first and second control gates;
spacers formed on the second partial circular sidewalls of the first and second control gates, respectively;
an insulation layer formed over the first and second floating gates and the polysilicon structure, between the first floating gate and the first control gate, between the second floating gate and the second control gate, and between first and second floating gates and the polysilicon structure; and
a shallow trench isolation (STI) structure for isolating the split gate device.

8. The device of claim 7 wherein the insulation layer includes a first insulation spacer formed over the first floating gate and a second insulation spacer formed over the second floating gate.

9. The device of claim 7 wherein the first and second floating gates each includes a width ranging from about 0.13 to about 0.23 micrometer.

10. The device of claim 7 wherein the height of the first and second floating gates is less than 5000 Angstroms.

11. The device of claim 7 wherein the insulation layer includes a low dielectric constant material.

12. The device of claim 7 wherein the first partial circular sidewalls of the first and second floating gates, respectively, face toward the each other, and wherein the second partial circular sidewalls of the first and second control gates, respectively, face away from each other.

* * * * *